United States Patent
Hsiao et al.

(10) Patent No.: US 12,501,748 B2
(45) Date of Patent: Dec. 16, 2025

(54) LIGHT-EMITTING DEVICE AND PRODUCTION METHOD THEREOF

(71) Applicant: TIANJIN SANAN OPTOELECTRONICS CO., LTD., Tianjin (CN)

(72) Inventors: Chihhung Hsiao, Tianjin (CN); Kunhuang Cai, Tianjin (CN); Duxiang Wang, Tianjin (CN); Chia-Hung Chang, Fujian (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 622 days.

(21) Appl. No.: 17/825,034

(22) Filed: May 26, 2022

(65) Prior Publication Data

US 2022/0285583 A1 Sep. 8, 2022

Related U.S. Application Data

(63) Continuation-in-part of application No. PCT/CN2019/121712, filed on Nov. 28, 2019.

(51) Int. Cl.
 *H10H 20/824* (2025.01)
 *H10H 20/01* (2025.01)
 *H10H 20/82* (2025.01)

(52) U.S. Cl.
 CPC .... *H10H 20/8242* (2025.01); *H10H 20/0137* (2025.01); *H10H 20/018* (2025.01); *H10H 20/82* (2025.01)

(58) Field of Classification Search
 CPC . H01L 33/0075; H01L 33/0093; H01L 33/12; H01L 33/14; H01L 33/22; H01L 33/305
 See application file for complete search history.

(56) References Cited

U.S. PATENT DOCUMENTS

| | | | |
|---|---|---|---|
| 9,331,239 B1* | 5/2016 | Lin | H10D 62/113 |
| 2017/0098735 A1* | 4/2017 | Huang | A01N 1/146 |
| 2017/0133556 A1* | 5/2017 | Chang | H10D 84/8316 |

FOREIGN PATENT DOCUMENTS

| | | |
|---|---|---|
| CN | 104821353 A | 8/2015 |
| CN | 105390575 A | 3/2016 |
| CN | 105845793 A | 8/2016 |

OTHER PUBLICATIONS

Search Report issued to PCT application No. PCT/CN2019/121712 on Aug. 28, 2020.

(Continued)

*Primary Examiner* — Matthew C Landau
*Assistant Examiner* — Dmitriy Yemelyanov
(74) *Attorney, Agent, or Firm* — MUNCY, GEISSLER, OLDS & LOWE, P.C.

(57) ABSTRACT

A light-emitting device includes a light-emitting laminating structure having an ohmic contact layer, a transition layer, a current-spreading layer, a first type semiconductor layer, an active layer, and a second type semiconductor layer. The current-spreading layer has aluminum, and, in the current-spreading layer, a relative content of the aluminum with respect to a composition of the current-spreading layer is fixed. The transition layer has aluminum, and, in the transition layer, a relative content of the aluminum with respect to a composition of the transition layer is less than the relative content of the aluminum in the current-spreading layer. A method for producing the light-emitting device is also disclosed.

20 Claims, 9 Drawing Sheets

(56) References Cited

OTHER PUBLICATIONS

Search Report appended to an Office Action, which was issued to Chinese counterpart application No. 201980005985.8 by the CNIPA on Jun. 30, 2023 (6 pages including English translation).

* cited by examiner

| | Condition | Size(mil) | Peak wavelength of light | Ohmic contact layer | Aluminum-free layer | Current-spreading layer | Opertaing voltage (10mA) |
|---|---|---|---|---|---|---|---|
| Sample 1 | without transition layer | 14 | 850nm | GaAs | InGaP | Al0.2Ga0.8As | 1.684 |
| Sample 2 | with transition layer | 14 | 850nm | GaAs | InGaP | Al0.2Ga0.8As | 1.599 |

FIG.16

LIGHT-EMITTING DEVICE AND PRODUCTION METHOD THEREOF

CROSS-REFERENCE TO RELATED APPLICATION

This application is a continuation-in-part application of PCT International Application No. PCT/CN2019/121712 filed on Nov. 28, 2019. The entire content of the international patent application is incorporated herein by reference.

FIELD

The present disclosure relates to a light-emitting device and a production method thereof.

BACKGROUND

Infrared light-emitting diodes (IR LEDs) are widely applied in several fields, such as security surveillance systems, wearable devices, space communication systems, remote control, medical appliances, light source of sensors, and night lighting systems, etc., due to its advantageous characteristics, e.g., specific waveband, low power consumption, and high reliability.

CN 105870227 A discloses a conventional infrared light-emitting diode having two different structures. A method for producing the conventional infrared light-emitting diode includes: forming a light-emitting laminating structure on a surface of a growth substrate (e.g. GaAs substrate) or transferring the light-emitting laminating structure to a surface of a substrate, then forming p and n electrodes on the light-emitting laminating structure. During a process for forming the light-emitting laminating structure, an n-type GaAs layer (serving as an ohmic contact layer) is usually formed on a GaAs substrate, followed by forming an n-type AlGaAs layer (serving as a current spreading layer). However, because of a large difference in a relative content of aluminum in the GaAs layer and the AlGaAs layer, considerable defects would occur at an interface therebetween, which would affect quality of the AlGaAs layer, thereby causing problems, such as high operating voltage in the light-emitting diode. If the interfacial defects is reduced, the quality of the AlGaAs layer might be improved effectively, and the problem of high operating voltage might be solved.

SUMMARY

Therefore, an object of the disclosure is to provide a light-emitting device and a production method thereof that can alleviate or overcome the aforesaid shortcomings of the prior art.

According to a first aspect of the disclosure, a light-emitting device includes a light-emitting laminating structure which includes an ohmic contact layer, a transition layer disposed on the ohmic contact layer, a current-spreading layer disposed on the transition layer opposite to the ohmic contact layer, a first type semiconductor layer disposed on the current-spreading layer opposite to the transition layer, an active layer disposed on the first type semiconductor layer opposite to the current-spreading layer, and a second type semiconductor layer disposed on the active layer opposite to the first type semiconductor layer. The current-spreading layer has aluminum, and, in the current-spreading layer, a relative content of the aluminum with respect to a composition of the current-spreading layer is fixed. The transition layer has aluminum, and, in the transition layer, a relative content of the aluminum with respect to a composition of the transition layer is less than the relative content of the aluminum in the current-spreading layer.

According to a second aspect of the disclosure, a light-emitting device includes a light-emitting laminating structure which includes an aluminum-free layer, a transition layer disposed on the aluminum-free layer, a current-spreading layer disposed on the transition layer opposite to the aluminum-free layer, a first type semiconductor layer disposed on the current-spreading layer opposite to the transition layer, an active layer disposed on the first type semiconductor layer opposite to the current-spreading layer, and a second type semiconductor layer disposed on the active layer opposite to the first type semiconductor layer. The current-spreading layer has aluminum, and, in the current-spreading layer, a relative content of the aluminum with respect to a composition of the current-spreading layer is fixed. The transition layer has aluminum, and, in the transition layer, a relative content of the aluminum with respect to a composition of the transition layer is less than the relative content of the aluminum in the current-spreading layer.

According to a third aspect of the disclosure, a method for producing a light-emitting device includes the following steps: forming an ohmic contact layer; forming a transition layer on the ohmic contact layer; forming a current-spreading layer on the transition layer opposite to the ohmic contact layer; forming a first type semiconductor layer on the current-spreading later opposite to the transition layer; forming an active layer on the first type semiconductor layer opposite to the current-spreading layer; and forming a second type semiconductor layer on the active layer opposite to the first type semiconductor layer. The current-spreading layer has aluminum, and, in the current-spreading layer, a relative content of the aluminum with respect to a composition of the current-spreading layer is fixed. The transition layer has aluminum, and, in the transition layer, a relative content of the aluminum with respect to a composition of the transition layer is less than the relative content of the aluminum in the current-spreading layer.

BRIEF DESCRIPTION OF THE DRAWINGS

Other features and advantages of the disclosure will become apparent in the following detailed description of the embodiments with reference to the accompanying drawings, of which:

FIG. 16 shows a table for comparing properties of the light-emitting devices formed with and without the transition layer.

DETAILED DESCRIPTION

Figure 1:
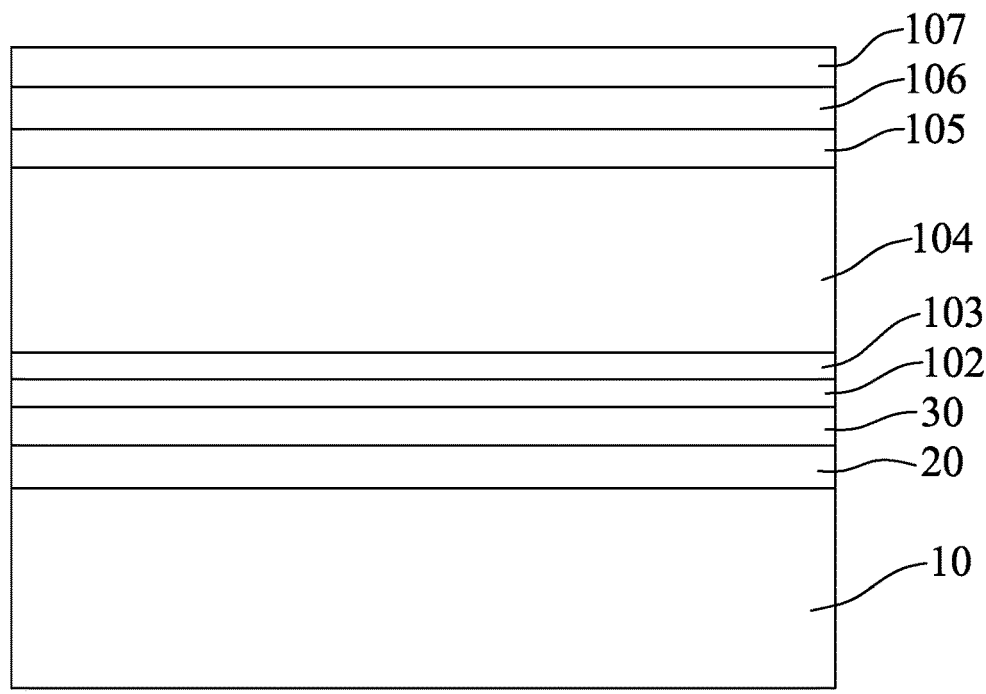
FIG. 1 is a schematic sectional view illustrating step 1 in the first embodiment of a method for producing a light-emitting device according to the present disclosure, and shows that a light-emitting laminating structure is formed on a growth substrate.

Before the disclosure is described in greater detail, it should be noted that where considered appropriate, reference numerals have been repeated among the figures to indicate corresponding or analogous elements, which may optionally have similar characteristics.

It should be noted that, the formation of a first component over or on a second component in the description below may include embodiments in which the first and second components are formed in direct contact, and may also include embodiments in which additional components may be formed between the first and second components, such that the first and second components may not be in direct contact.

First Embodiment

FIGS. 1, and 4 to 9 illustrate a method for producing a first embodiment of a light-emitting device of the present disclosure.

In step 1, referring to FIG. 1, a growth substrate 10, e.g., GaAs substrate is provided. Then, a light-emitting laminating structure is formed on the substrate 10 by epitaxy such as metalorganic chemical vapor deposition (MOCVD). The light-emitting laminating structure includes an ohmic contact layer 102, a transition layer 103, a current-spreading layer 104, a first type semiconductor layer 105, an active layer 106, and a second type semiconductor layer 107 sequentially formed on the growth substrate 10.

In this embodiment, the growth substrate 10 may be a GaAs substrate doped with a single crystal of silicon.

The ohmic contact layer 102 has a composition represented by $Al_xGa_{1-x}As$ with $0 \leq x \leq 1$. In this embodiment, the ohmic contact layer 102 may be a GaAs layer which has a relative high n-type doping concentration, such as greater than $1 \times 10^{18}/cm^3$, and has a thickness of less than 200 nm. In certain embodiments, the ohmic contact layer 102 has the n-type doping concentration of greater than $2 \times 10^{18}/cm^3$, and the thickness ranging from 50 nm to 100 nm.

The current-spreading layer 104 has aluminum, and, in the current-spreading layer, a relative content of the aluminum with respect to a composition of the current-spreading layer 104 is fixed. In this embodiment, the composition of the current-spreading layer 104 is represented by $Al_yGa_{1-y}As$ with $0.1 \leq y \leq 0.4$ and $y-x \geq 0.1$. The value of y may be $0.2 \leq y \leq 0.35$. Furthermore, the current-spreading layer 104 has the n-type doping concentration ranging from $3 \times 10^{17}/cm^3$ to $2 \times 10^{18}/cm^3$, and a thickness (t1) ranging from 5 μm to 8 μm.

The transition layer 103 has aluminum, and, in the transition layer, a relative content of the aluminum with respect to a composition of the transition layer 103 is less than the relative content of the aluminum in the current-spreading layer 104. The transition layer 103 has the same doping type (i.e. n-type in this embodiment) and doping concentration as those of the current-spreading layer 104. Furthermore, the transition layer 103 and the current-spreading layer 104 have the same elements in compositions thereof, but not the same atomic ratio. In certain embodiments, the composition of the transition layer 103 is represented by $Al_zGa_{1-z}As$ with $0 < z < 1$ and $x < z < y$. In certain embodiments, the transition layer 103 has a thickness (t0) ranging from 0.05 μm to 1 μm (e.g., 0.4 μm to 0.6 μm), and thus, is a very thin layer formed between the ohmic contact layer 102 and the current-spreading layer 104, so that production cost of the light-emitting device of this disclosure would not be increased obviously.

Figure 2:
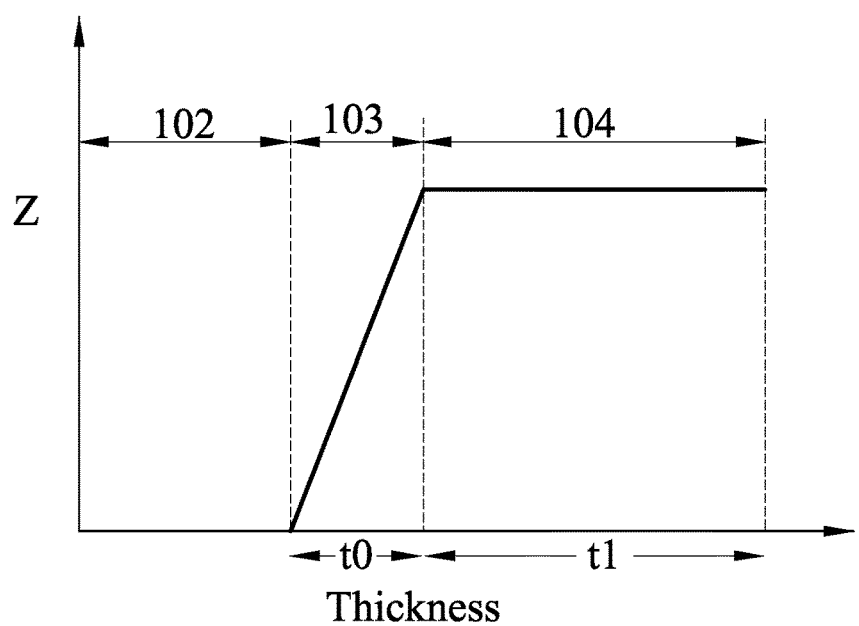
FIGS. 2 and 3 are graphs each illustrating distribution of relative content of aluminum within an ohmic contact layer, a transition layer, and a current-spreading layer in the first embodiment.
Figure 3:
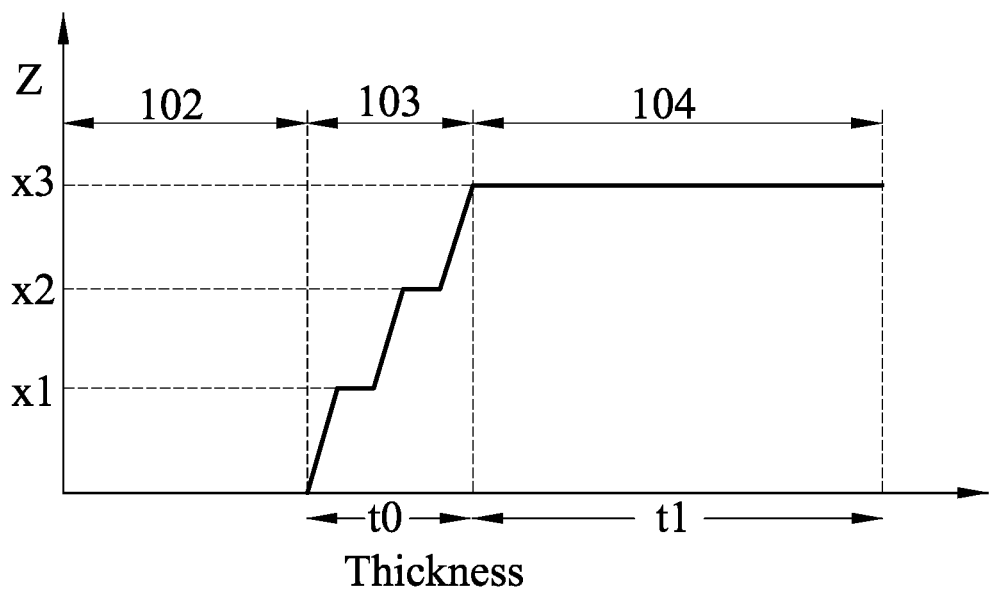

The variation of the relative content of the aluminum in the transition layer 103 from the ohmic contact layer 102 to the current-spreading layer 104 is described as below. FIGS. 2 and 3 each illustrates distribution of the relative content of the aluminum in the transition layer 103 from the ohmic contact layer 102 to the current-spreading layer 104, in which the horizontal axis represents the thickness of each layers, and the vertical axis represents amount of the relative content of the aluminum. The relative content of aluminum refers to the atomic content of aluminum with respect to the atomic content of a composition ($Al_zGa_{1-z}As$) of the transition layer 103, and can also be represented by z of $Al_zGa_{1-z}As$.

Since the transition layer 103 and the current-spreading layer 104 have the same elements in the composition, an interface therebetween is difficult to be observed by high magnification microscopy using transmission electron microscope (TEM) or scanning electron microscope (SEM). TEM in combination with energy dispersive X-ray spectroscopy (EDX) or secondary-ion mass spectrometry (SIMS) analysis may be used to observe the distribution of the relative content of the aluminum in the transition layer 103 and the current-spreading layer 104.

Referring to FIG. 2, the relative content of the aluminum in the transition layer 103 is increased gradually from the ohmic contact layer 102 to the current-spreading layer 104. In certain embodiments, the relative content of the aluminum is 0 in the ohmic contact layer 102, and increases linearly from an interface of the ohmic contact layer 102 and the transition layer 103 to an interface of the transition layer 103 and the current-spreading layer 104 along thickness direction thereof. In certain embodiments, the transition layer 103 may be a single layer which has the thickness t0, and the relative content of the aluminum (i.e. z value in $Al_zGa_{1-z}As$) in the single layer is increased linearly along the thickness t0, and then is kept at a fixed value in the current-spreading layer 104 along the thickness t1 thereof. In some embodiments, referring to FIG. 3, the relative content of the aluminum in the transition layer 103 is increased in a stepwise manner. To be specific, the transition layer 103 may have a plurality of $Al_zGa_{1-z}As$ sub-layers, and the relative content of the aluminum (i.e., z value) in each of $Al_zGa_{1-z}As$ sub-layers is increased linearly along the thickness direction. For instance, in a case of the transition layer 103 having five sub-layers (i.e., first to fifth sub-layers), z value is increased linearly from 0 to x1 in the first sub-layer that is adjacent to the ohmic contact layer 102, kept in x1 in the second sub-layer, and increased linearly from x1 to x2 in the third sub-layer, kept in x2 in the fourth sub-layer, and then increased linearly from x2 to x3 in the sub-fifth layer. The relative content of the aluminum in the current-spreading layer 104 is kept at x3, i.e. y=x3. That is to say, the relative content of the aluminum in the current-spreading layer 104 is in a stable and constant state as shown in FIGS. 2 and 3.

It should be noted that, in order to form the transition layer 103 with the relative content of the aluminum as shown in FIG. 2 or 3, during formation of the $Al_zGa_{1-z}As$ layer, z is increased from 0 to 0.3, and a supply rate of aluminum is increased in a linear manner or in a stepwise manner.

Since the transition layer 103 is formed between the ohmic layer 102 and the current-spreading layer 104, an abnormal growth (e.g. agglomeration of aluminum) of the current-spreading layer 104 caused by large difference in the relative content of the aluminum in the ohmic layer 102 and the current-spreading layer 104 in the conventional infrared light emitting diode would be avoided, so that the problems in the conventional light-emitting device, such as high operating voltage, poor current spreading effect, and low light emitting uniformity, would be eliminated.

The term "first type" refers to (a portion/layer of) the semiconductor layers 105, 107 being doped with a first conductivity type dopant, and the term "second type" refers to the semiconductor layers 105, 107 being doped with a second conductivity type dopant that is opposite in conductivity type to the first conductivity type dopant. For instance, the first conductivity type dopant may be a n-type dopant providing electrons, and the second conductivity type dopant may be an p-type dopant providing holes, and vice versa. In this embodiment, the first type semiconductor layer 105 is an n-type doping layer, and the second type semiconductor layer 107 is a p-type doping layer. Furthermore, the ohmic contact layer 102, the transition layer 103, and the current-spreading layer 104 have the same doping type as that of the first type semiconductor layer 105. In certain embodiments, each of the first type semiconductor layer 105, the active layer 106, and the second type semiconductor layer 107 is made of a GaAs-based material, and may contain aluminum or indium to obtain its desired functions. In this embodiment, the first type semiconductor layer 105 may be an n-type AlGaAs layer having a doping concentration ranging from $5\times10^{17}/cm^3$ to $2\times10^{18}/cm^3$ (e.g., $1\times10^{18}/cm^3$) and a thickness ranging from 0.1 µm to 10 µm, and the second type semiconductor layer 107 may be p-type AlGaAs layer having a doping concentration ranging from $8\times10^{17}/cm^3$ to $6\times10^{18}/cm^3$ (e.g., $1\times10^{18}/cm^3$).

In this embodiment, the active layer 106 may be configured to emit light having a wavelength of greater than 680 nm (infrared), and has a bandgap smaller than bandgaps of the first and second semiconductor layers 105, 107. It should be noted that, in some embodiments, the active layer 106 may be a multi-quantum well structure with or without doping. The multi-quantum well structure includes alternately overlaid well layers and barrier layers. Each of the well layers is made of an InGaAs material and has a thickness ranging from 3 nm to 15 nm. Each of the barrier layers is made of an AlGaAs material and has a thickness ranging from 5 nm to 50 nm. A pair of the well layer and the corresponding barrier layer constitute a layer unit. The number of the layer unit ranges from 1 to 25, e.g., from 3 to 12.

By adjusting a content of the elements of the composition of the well layer, the wavelength of the light emitted from the active layer 106 may be adjusted.

It should be noted that, in certain embodiments, before the light-emitting laminating structure is formed, a buffer layer 20 (e.g. GaAs layer) and an etch stop layer 30 (e.g. InGaP layer) may be optionally formed on the growth substrate 10 (see FIG. 1). The buffer layer 20 may alleviate a problem associated with lattice difference between the light-emitting laminating structure and the structure 10. The etch stop layer 30 is used for stopping etch to prevent the ohmic contact layer 102 of the light-emitting laminating structure from being etched during removing procedure of the growth substrate 10 (to be described hereinafter) when the light-emitting laminating structure is transferred to another substrate.

In some embodiments, an additional current-spreading layer (not shown in FIG. 1) is further formed on the second type semiconductor layer 107. The additional current-spreading layer may include a material having good ohmic contact characteristic, e.g., GaP, have a thickness ranging from 0.02 µm to 0.1 µm, have the doping type (i.e. n-type in this embodiment) same as the second type semiconductor layer 107, and have a high doping concentration greater than $1\times10^{19}/cm^3$.

Figure 4:
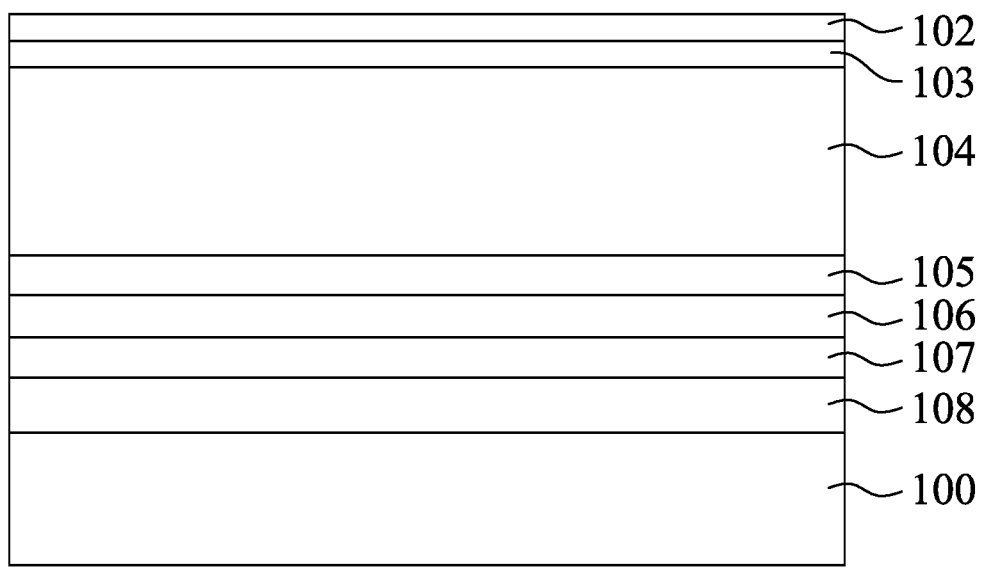
FIG. 4 is a schematic sectional view illustrating step 2 in the first embodiment of the method, and shows that the light-emitting laminating structure is transferred to a supporting substrate and the growth substrate is removed.

In step 2, referring to FIG. 4, a specular reflection layer 108 is formed on the second type semiconductor layer 107 of the light-emitting laminating structure or on the additional current-spreading layer, and a supporting substrate 100 is bonded to the specular reflection layer 108 through a bonding layer (not shown in FIG. 4). Then, the growth substrate 10 is removed by a wet etching process (in a case of the growth substrate 10 is GaAs substrate) to expose the ohmic contact layer 102. Thus, the light-emitting laminating structure is transferred to the supporting substrate 100.

In certain embodiments, the supporting substrate 100 may be a conductive substrate (e.g., a metal substrate) or an insulated substrate, and has a thickness which is sufficient to support the layers and electrodes disposed thereon.

The specular reflection layer 108 may be one of a metal reflection layer, an omni-directional reflector (ODR) containing a metal reflection layer and a transparent medium layer or a transparent conducting layer, and a Bragg reflection layer containing two types of transparent insulated layers with different refractive indices, such as silicon oxide layers and titanium oxide layers which are alternately arranged. The specular reflection layer 108 may reflect the light which is emitted by the active layer 106 toward the current-spreading layer 104 and/or toward a side of the light-emitting laminating structure.

Figure 5:
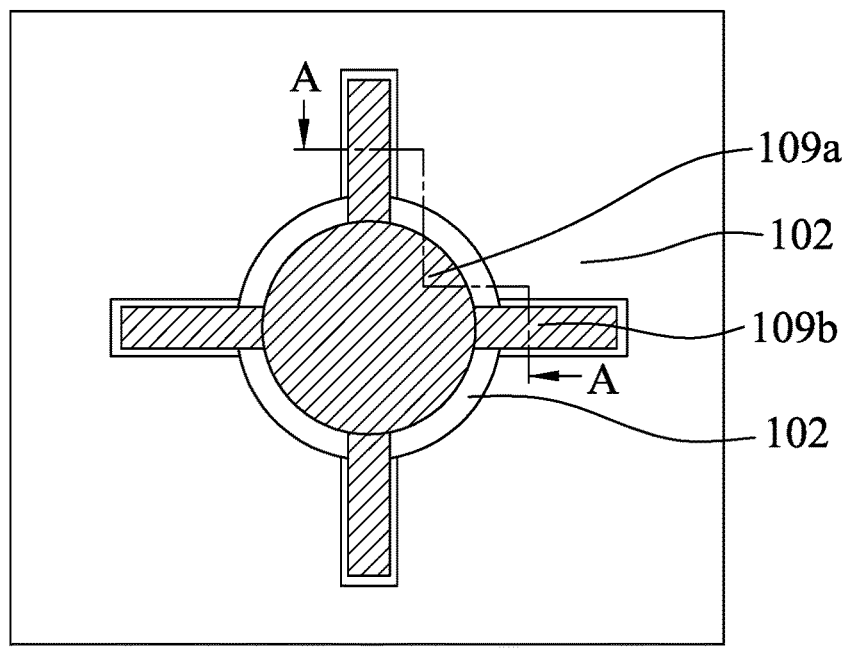
FIG. 5 is a top view illustrating step 3 in the first embodiment of the method, and shows that a first electrode is disposed on the ohmic contact layer of the light-emitting laminating structure.
Figure 6:
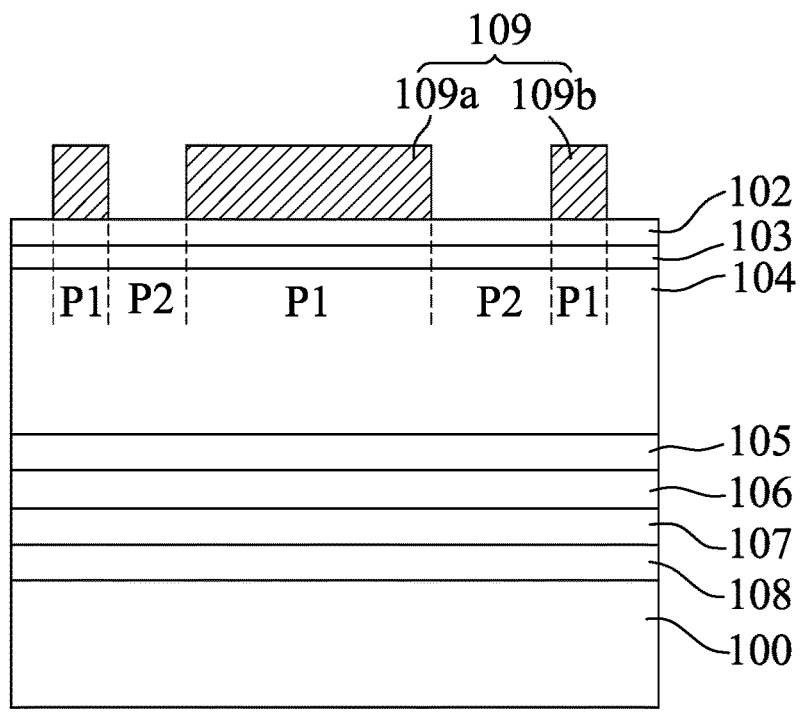
FIG. 6 is a sectional view taken along line A-A of FIG. 5.

In step 3, referring to FIGS. 5 and 6, a first electrode 109 is formed on the ohmic contact layer 102, such that a part of the ohmic contact layer 102 is exposed from the first electrode 109. The first electrode 109 forms good ohmic contact with the ohmic contact layer 102.

In this embodiment, referring to FIGS. 5 and 6, the first electrode 109 has a main part 109a which has a bonding position for subsequent bonding process, and at least one extension part 109b for providing a current spreading function in a horizontal direction perpendicular to the thickness direction. Furthermore, referring to FIG. 6, the current-spreading layer 104 has a first portion (P1) that is corresponding in position to the first electrode 109 (i.e. the first portion (P1) is covered by the first electrode 109), and a second portion (P2) that is not registered with the first electrode 109 (i.e., outside of the first portion (P1)).

In some embodiments, the ohmic contact layer 102 may not be interposed between the main part 109a and the transition layer 103, and may be only disposed between the extension part 109b and the transition layer 103. In this case, since the ohmic contact is not between the main part 109a and the transition layer 103, a current may not pass from the main part 109a to the light-emitting laminating structure, but pass from the extension part 109b to the light-emitting laminating structure.

Figure 7:
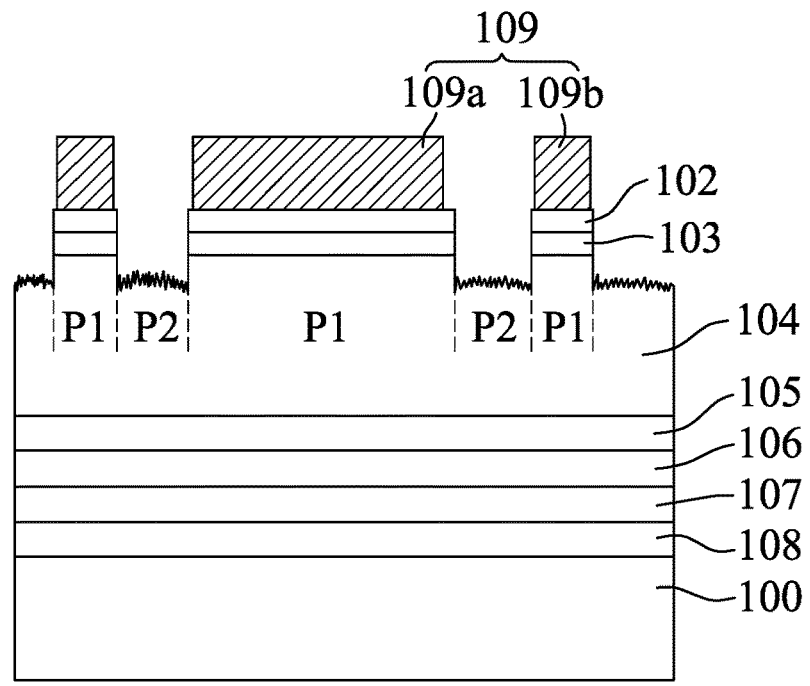
FIG. 7 is a schematic sectional view illustrating step 4 in the first embodiment of the method, and shows that a portion of the current-spreading layer is etched and roughened.

In step 4, referring to FIG. 7, a mask (not shown in FIG. 7) is disposed on the first electrode 109, and the part of the ohmic contact layer 102 exposed from the first electrode 109 is also exposed from the mask. Then, the part of the ohmic contact layer 102 exposed from the first electrode 109 and the transition layer 103 underlying the exposed part of the ohmic contact layer 102 are etched to expose the second portion (P2) of the current-spreading layer 104. The exposed second portion (P2) of the current-spreading layer 104 is etched to form a patterned or roughened structure, and functions as a light exiting surface. In some embodiments, etching of the ohmic contact layer 102, the transition layer 103, and the current-spreading layer 104 may be conducted in a single etching process or multiple etching processes. The etching process may be a wet etching process. Furthermore, an etchant used in the etching process may be an acid, e.g., hydrochloric acid, sulfuric acid, hydrofluoric acid, citric acid, or other chemical reagent.

Figure 8:
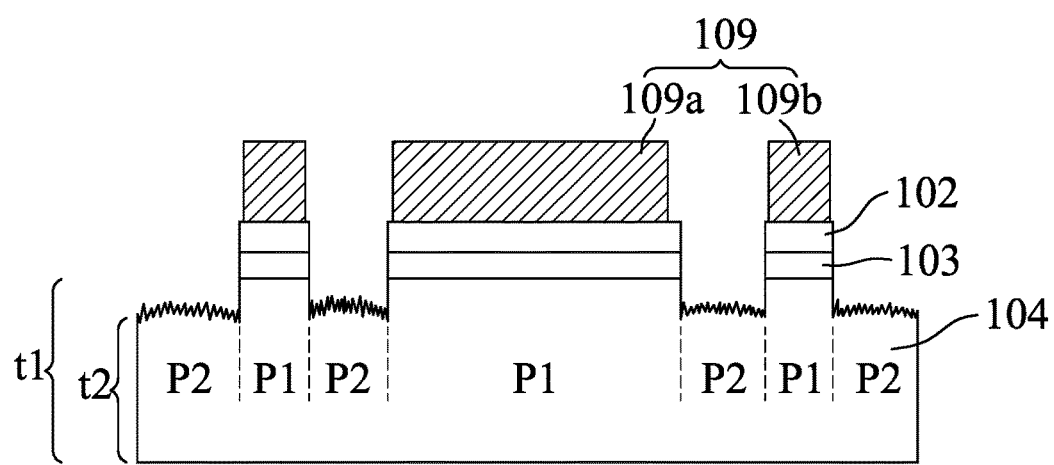
FIG. 8 shows first and second portions of the current-spreading layer and thickness thereof.

Referring to FIG. 8, the ohmic contact layer 102, the transition layer 103, and the first portion (P1) of the current-spreading layer 104 underlying the first electrode 109 (i.e., covered and protected by the first electrode 109) would not be etched during the etching process. Therefore, a surface of the first portion (P1) would not be roughened. In the thickness direction, the first portion (P1) of the current-spreading layer 104 has a thickness (t1) that is an original thickness of the current-spreading layer 104, and the patterned second portion (P2) of the current-spreading layer 104 has a thickness (t2) that is less than the thickness (t1) of the first portion (P1). In this embodiment, the thickness t1 of the first portion P1 is in a range of from 5 μm to 8 μm, and the thickness t2 of the second portion P2 is in a range of from 2 μm to 4 μm, e.g., 3 ∞m to 4 μm. In some embodiments, a difference between the thickness (t2) and the thickness (t1) may be in a range of from 3 μm to 4 μm. The second portion (P2) has a roughness no greater than 1 μm.

It should be noted that, the lower the relative content of the aluminum, the slower the wet etching rate is. Since the relative content of the aluminum in the transition layer 103 is lower than the relative content of the aluminum in the current-spreading layer 104, in a case of using the single wet etching procedure for etching the transition layer 103 and roughening the current-spreading layer 104, the transition layer 103 may adversely affect the roughening effect of the current-spreading layer 104. In order to obtain a more uniform roughening surface of the second portion (P2) of the current-spreading layer 104, and to ensure a good light-emitting efficiency, the thickness (t0) of the transition layer 103 is designed to be relatively thin, e.g., less than 1 μm. As mentioned above, the thickness (t0) of the transition layer 103 may range from 0.05 μm to 1 μm. In certain embodiments, the thickness (t0) ranges from 200 nm to 600 nm. If the thickness (t0) of the transition layer 103 is too large, e.g., greater than or equal to 1 μm, the transition layer 103 may remain on the second portion (P2) of the current-spreading layer 104, the rate for etching the transition layer 103 would be decreased, thus the time for etching the transition layer 103 would be increased, which may cause the uniformity of the surface roughness of the second portion (P2) of the current-spreading layer 104 difficult to be controlled. Thus, the light-emitting efficiency would be reduced.

Figure 9:
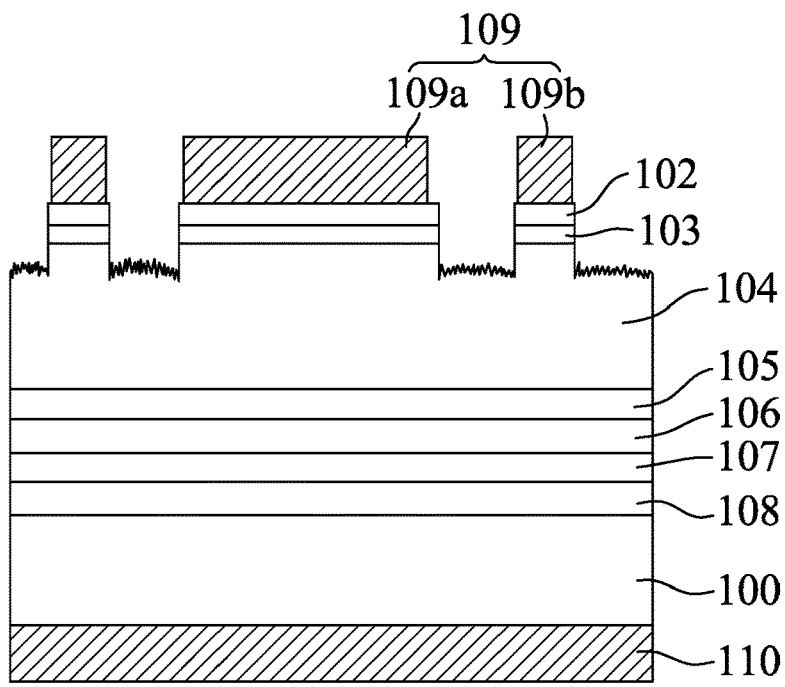
FIG. 9 is a schematic sectional view illustrating step 5 in the first embodiment of the method, and shows that a second electrode is disposed on the substrate.

In step 5, referring to FIG. 9, a second electrode 110 is formed on a side of the supporting substrate 100 opposite to the light-emitting laminating structure. In this embodiment, since the supporting substrate 100 is a conductive substrate, a current may flow among the first electrode 109, the light-emitting laminating structure, and the second electrode 110. It should be noted that, in this embodiment, the second electrode 110 may be formed on the supporting substrate 100 at a side where the light-emitting laminating structure is located. When the supporting substrate 100 is an insulated substrate, the second electrode 110 is formed on the supporting substrate 100 at a side where the light-emitting laminating structure is located.

Moreover, each of the first and second electrodes 109, 110 may include a transparent conducting material, a metal material, or a combination thereof. The transparent conducting material may be an indium tin oxide (ITO) or a thin metal film, and the metal material may include GeAuNi, AuGe, AuZn, Au, Al, Pt, Ti, or combinations thereof.

In step 6, according to requirements, the aforesaid configuration having the light-emitting laminating structure, the specular reflection layer 108, the supporting substrate 100, and the first and second electrodes 109, 110, is divided into a plurality of unitized light-emitting devices as shown in FIG. 9 by an etching process or a dicing process.

It should be noted that, referring to FIG. 9, the current-spreading layer 104 of the light-emitting device has a first surface contacting with the first type semiconductor layer 105, and a second surface opposite to the first surface. The second surface of the current-spreading layer 104 has an interface area (i.e., corresponding to first portion (P1)) disposed below the first electrode 109 and contacting with the transition layer 103, and a light-emitting area (corresponding to the second portion (P2)) surrounding the interface area. The light-emitting area may be a patterned surface or a roughened surface. The patterned surface of the current-spreading layer 104 may have a regular pattern. The roughened surface of the current-spreading layer 104 may be formed with a regular or an arbitrary irregular micro/nano-structure structure. The patterned or roughened surface of the current-spreading layer 104 is configure to facilitate exit of light, so as to increase the luminous efficiency of the light-emitting device. In this embodiment, the light-emitting area of the current-spreading layer 104 is a roughened surface having a height difference (between highest and lowest point of the roughened surface) of less than 1 μm, e.g., from 100 nm to 300 nm. In addition, as shown in FIG. 9, the light-emitting area is lower than the interface area.

Since the transition layer 103 is formed between the ohmic contact layer 102 and the current-spreading layer 104, the defects occurring at the interface of the ohmic contact layer 102 and the current-spreading layer 104 in the conventional infrared light-emitting diodes may be alleviated, and a crystal quality of the current-spreading layer 104 may be improved. Therefore, a resistance and an operating voltage of the light-emitting device may be reduced, and a current spreading effect and brightness may be enhanced.

The first embodiment of the light-emitting device according to the present disclosure may be applied as an infrared light-emitting device, and compared to the conventional infrared light emitting diode, such light-emitting device has better photoelectric characteristics.

Second Embodiment

Figure 10:
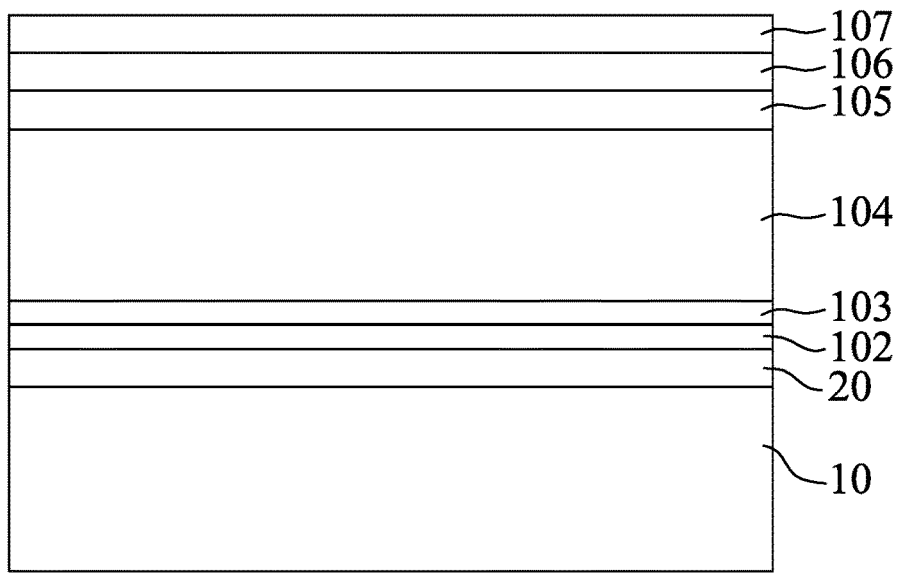
FIG. 10 is a schematic sectional view showing a step in the second embodiment of a method for producing a light-emitting device according to the present disclosure.
Figure 11:
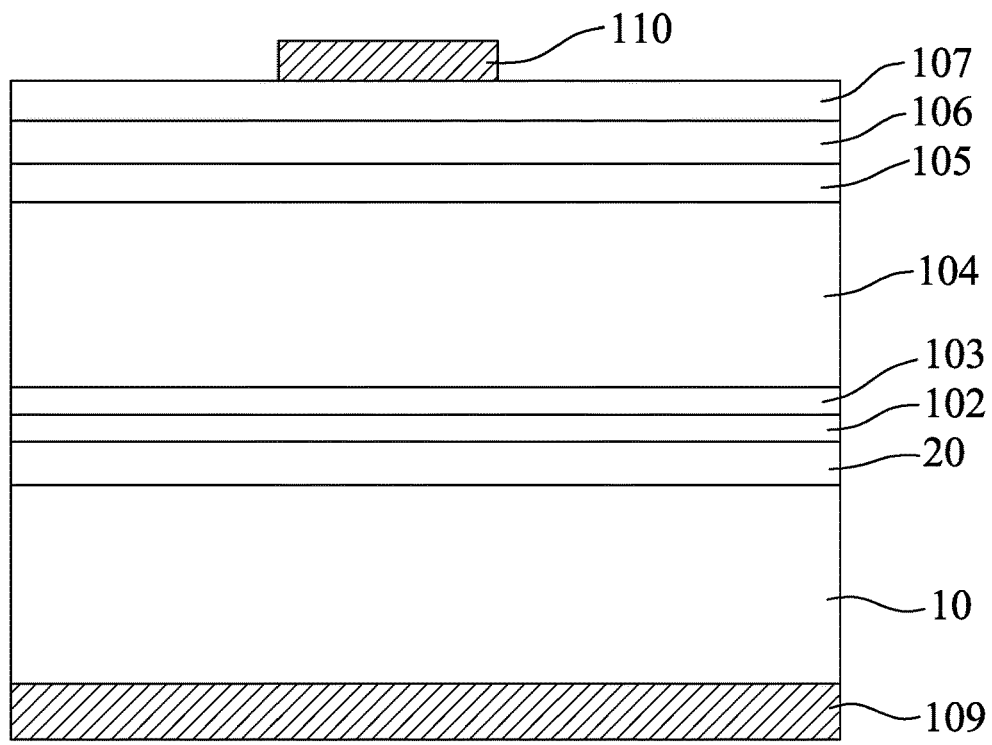
FIG. 11 is a schematic sectional view showing a step of forming first and second electrodes in the second embodiment.

FIGS. 10 and 11 illustrate a method for producing a second embodiment of the light-emitting device of the present disclosure.

In this embodiment, referring FIG. 10, a buffer layer 20 is formed on a growth substrate 10. The growth substrate 10 may be an n-type GaAs substrate doped with a single crystal of silicon. The buffer layer 20 includes GaAs and has an n-type doping concentration ranging from $8\times10^{17}/cm^3$ to $5\times10^{18}/cm^3$, e.g., $2\times10^{18}/cm^3$.

Then, an ohmic contact layer 102, a transition layer 103, a current-spreading layer 104, a first type semiconductor layer 105, an active layer 106, a second type semiconductor layer 107, are sequentially formed on the buffer layer 20 so as to form a light-emitting laminating structure on the buffer layer 20. It should be noted that, the light-emitting laminating structure in the second embodiment is similar to that of the first embodiment.

Referring to FIG. 11, the first electrode 109 is formed the growth substrate 10 opposite to the light-emitting laminating structure, and the second electrode 110 is formed on the second type semiconductor layer 107.

Finally, according to requirements, the aforesaid configuration having the growth substrate 10, the buffer layer 20, and the light-emitting laminating structure, is divided into a plurality of unitized light-emitting devices by an etching process or dicing process.

It should be noted that, since the transition layer 103 is formed between the ohmic layer 102 and the current-spreading layer 104 in the light-emitting laminating structure, the light-emitting device of the second embodiment may have merits same as those of the first embodiment.

Differences between the first and second embodiments are described below. The light emitting device of the second embodiment retains the growth substrate 10, and the light exiting surface is located on the second type semiconductor layer 107.

Third Embodiment

Figure 12:
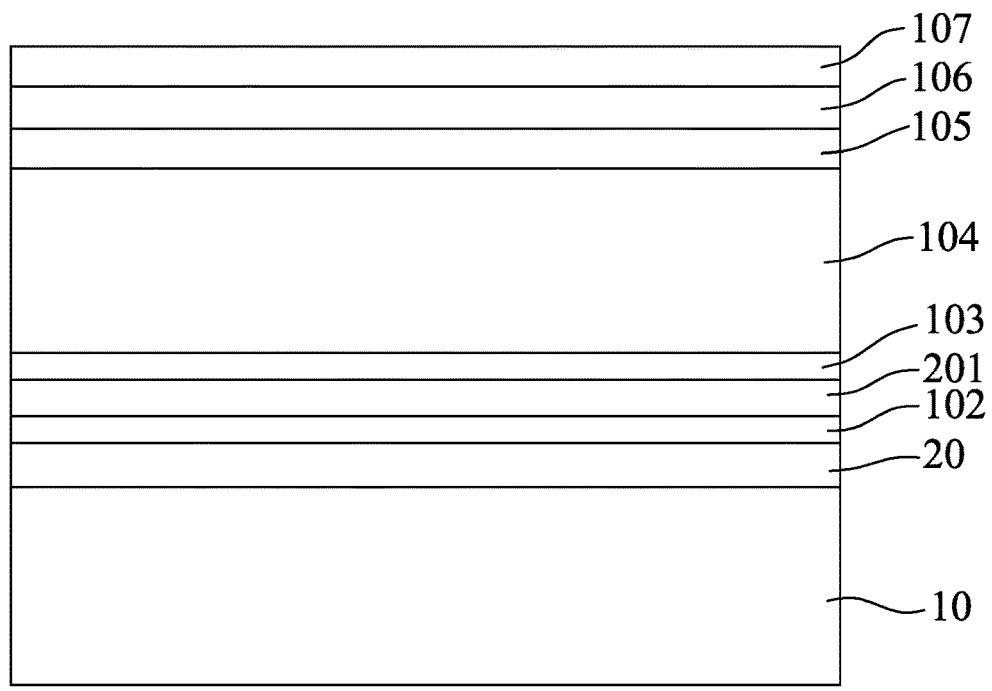
FIG. 12 is a schematic sectional view showing a step in the third embodiment of a method for producing a light-emitting device according to the present disclosure.
Figure 13:
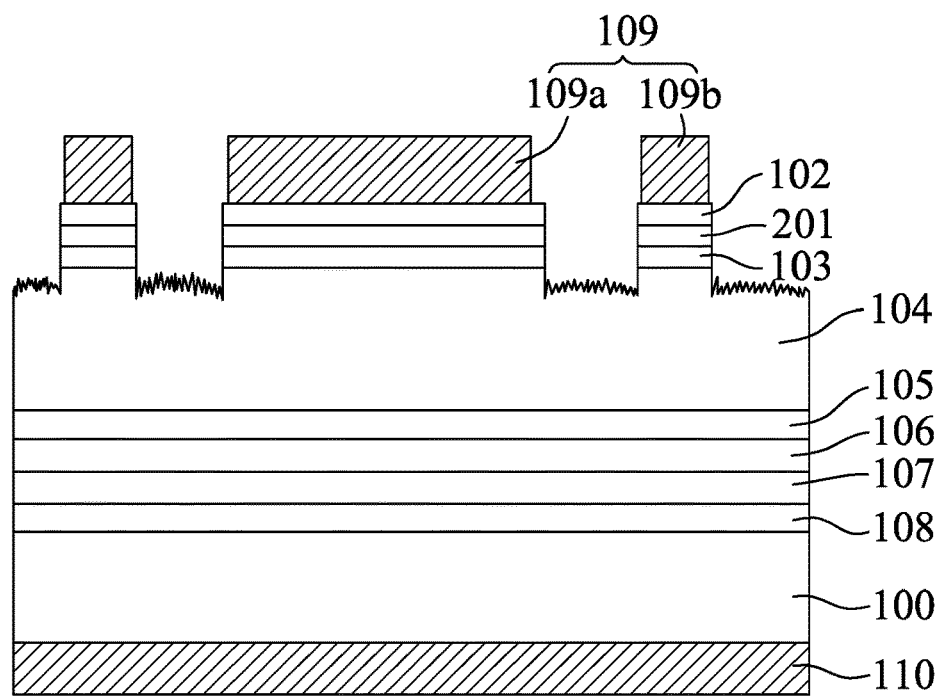
FIG. 13 is a schematic sectional view showing the light-emitting device produced by the second embodiment of the method.

FIGS. 12 and 13 illustrate a method for producing a third embodiment of the light-emitting device of the present disclosure.

In the third embodiment, the production method and a configuration of the light-emitting device is generally similar to that of the first embodiment, except for the following differences.

In this embodiment, referring to FIGS. 12 and 13, the light-emitting laminating structure further includes an aluminum-free layer 201 that is interposed between the ohmic contact layer 102 and the transition layer 103. The aluminum-free layer 201 is an InGaP layer, and has a doping type the same as that of the current-spreading layer 104 (i.e. n-type in this embodiment). Furthermore, the aluminum-free layer 201 has a thickness ranging from 50 nm to 150 nm, and a doping concentration ranging from $1\times10^{18}/cm^3$ to $3\times10^{18}/cm^3$. The InGaP layer may enhance an adhesion strength between the main part 109a of the first electrode 109 and the light-emitting laminating structure in the case that the ohmic contact layer 102 is not interposed between the main part 109a and the transition layer 103, so as to improve the reliability of the light-emitting device.

It should be noted that, there is a relatively large difference in lattice constant between the InGaP layer (i.e. the aluminum-free layer 201) and the AlGaAs layer (i.e. the current-spreading layer 104), which causes lattice mismatch therebetween. As the relative content of the aluminum in the current-spreading layer 104 (i.e. y of the $Al_yGa_{1-y}As$) is increased, the lattice mismatch may be more obvious, causing the quality of the current-spreading layer 104 to be adversely affected, thereby resulting in high voltage, poor current spreading effect, and low light emitting uniformity. Therefore, in order to solve the aforesaid problems, the transition layer 103 is formed between the aluminum-free layer 201 and the current-spreading layer 104.

In this embodiment, the growth substrate, the buffer layer 20, the ohmic contact layer 102, the transition layer 103, the current-spreading layer 104, the first type semiconductor layer 105, the active layer 106, the second type semiconductor layer 107, the specular reflection layer 108, the first and second electrodes 109, 110, and the supporting substrate 100 are similar to those of the first embodiment.

Figure 14:
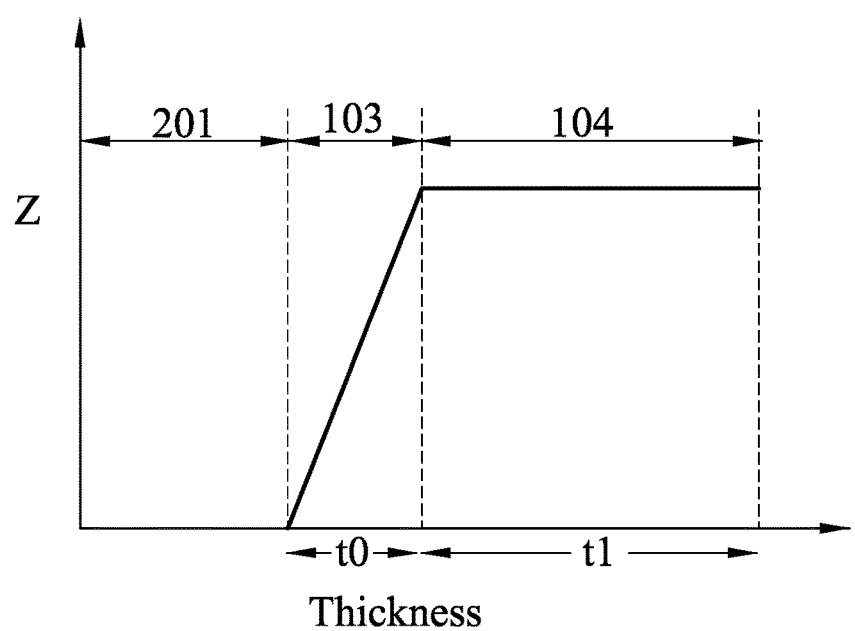
FIGS. 14 and 15 are graphs each illustrating distribution of relative content of aluminum within an aluminum-free layer, a transition layer, and a current-spreading layer in the third embodiment.
Figure 15:
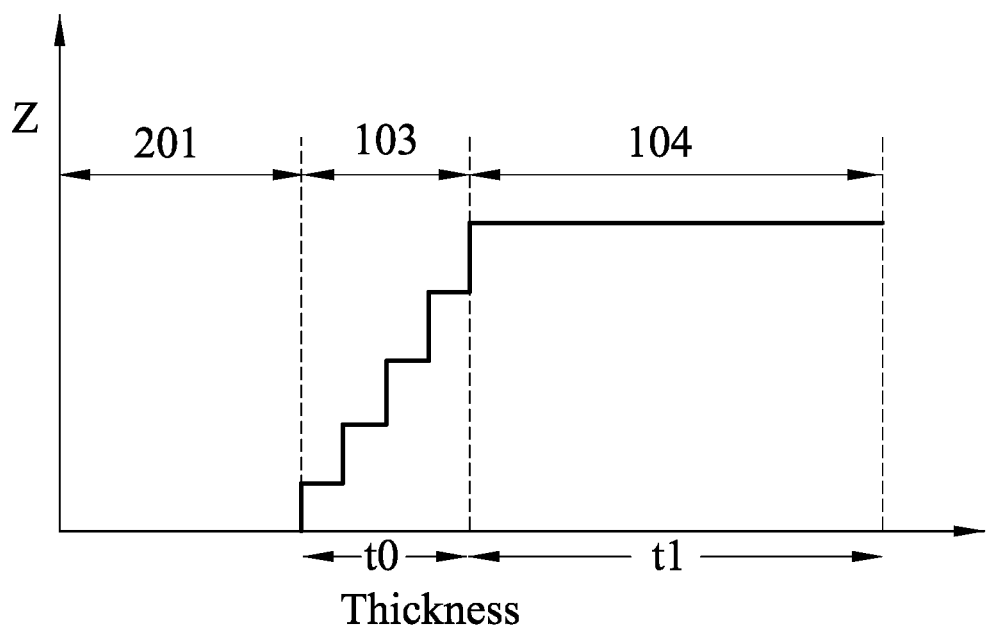

Similarly to the first embodiment, referring to FIGS. 14 and 15, the relative content of the aluminum in the transition layer 103 of this embodiment is increased in a linear manner or in a stepwise manner from the aluminum-free layer 201 to the current-spreading layer 104, i.e., from the interface of the aluminum-free layer 201 and the transition layer 103 to the interface of the transition layer 103 and the current-spreading layer 104 along the thickness direction.

FIG. 16 shows a table for comparing properties of the light-emitting devices formed without and with the transition layer 103 (i.e., samples 1 and 2). Sample 2 is the embodiment of the light-emitting device of this disclosure, which has the transition layer 103 interposed between the aluminum-free layer 201 and the current-spreading layer 104. Sample 1 have the structure similar to that of sample 1 except that sample 1 does not include the transition layer 103. Sample 1 and sample 2 are supplied with 10 mA current to perform a lighting test. As shown in the table, the operating voltage of sample 2 is 1.599 V, which is 0.09 V lower than that of sample 1 (1.684 V). The uniformity of the surface roughness of the current-spreading layer 104, the current spreading effect, and the light emitting uniformity in the sample 2 are also better than those of sample 1.

Fourth Embodiment

In the fourth embodiment, a configuration of a light emitting device is generally similar to that of the first to third embodiments, except for the following differences.

In this embodiment, the first type semiconductor layer 105, the active layer 106, and the second type semiconductor layer 107 may be made of an AlGaInP-based material, so that the light-emitting device may emit light having a wavelength ranging from 560 nm to 680 nm.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device, comprising:
   a light-emitting laminating structure which includes
   an ohmic contact layer,
   a transition layer disposed on said ohmic contact layer,
   a current-spreading layer disposed on said transition layer opposite to said ohmic contact layer,
   a first type semiconductor layer disposed on said current-spreading layer opposite to said transition layer,
   an active layer disposed on said first type semiconductor layer opposite to said current-spreading layer, and
   a second type semiconductor layer disposed on said active layer opposite to said first type semiconductor layer,
   wherein
   said current-spreading layer has aluminum, and, in said current-spreading layer, a relative content of said aluminum with respect to a composition of said current-spreading layer is fixed, and
   said transition layer has aluminum, and, in said transition layer, a relative content of said aluminum with respect to a composition of said transition layer is less than said relative content of said aluminum in said current-spreading layer.

2. The light-emitting device according to claim 1, wherein said transition layer and said current-spreading layer have the same component element which is gallium or arsenide.

3. The light-emitting device according to claim 1, wherein said ohmic contact layer has a composition represented by $Al_xGa_{1-x}As$, wherein $0 \leq x \leq 1$.

4. The light-emitting device according to claim 3, wherein the composition of said current-spreading layer is represented by $Al_yGa_{1-y}As$, wherein $0.1 \leq y \leq 0.4$, and $y-x \geq 0.1$.

5. The light-emitting device according to claim 1, wherein said light-emitting laminating structure further includes an aluminum-free layer that is interposed between said ohmic contact layer and said transition layer, said aluminum-free layer is an InGaP layer, said aluminum-free layer has a doping type the same as that of said current-spreading layer, and a thickness that ranges from 50 nm to 150 nm.

6. The light-emitting device according to claim 1, wherein said transition layer has a thickness ranging from 0.05 μm to 1 μm.

7. The light-emitting device according to claim 1, further comprising a first electrode disposed on said ohmic contact layer, said current-spreading layer having a first portion that is corresponding in position to said first electrode, said first portion having a thickness ranging from 5 μm to 8 μm.

8. The light-emitting device according to claim 1, further comprising a first electrode including a main part having a bonding position, and at least one extension part, said main part is not disposed on said ohmic contact layer, said extension part is disposed on said ohmic contact layer.

9. The light-emitting device according to claim 8, wherein said light-emitting laminating structure further includes an InGaP layer that is interposed between said ohmic contact layer and said transition layer, said first electrode includes a main part having a bonding position, and at least one extension part, said main part is disposed on said InGaP layer, said extension part is disposed on said ohmic contact layer.

10. The light-emitting device according to claim 9, wherein said relative content of said aluminum in said transition layer is increased from said InGaP layer to said current-spreading layer.

11. The light-emitting device according to claim 1, further comprising a first electrode disposed on said ohmic contact layer, said current-spreading layer having a first portion and a second portion that is outside of said first portion, said second portion having a thickness less than said thickness of said first portion.

12. The light-emitting device according to claim 11, wherein said thickness of said second portion of said current-spreading layer ranges from 2 μm to 4 μm.

13. The light-emitting device according to claim 11, wherein said second portion of said current-spreading layer is formed with a patterned structure and functions as a light-exiting surface.

14. The light-emitting device according to claim 11, wherein said second portion has a roughness not greater than 1 μm.

15. The light-emitting device according to claim 1, further comprising:
    a substrate disposed on said light-emitting laminating structure; and
    a first electrode that is disposed on said substrate opposite to said light-emitting laminating structure,
    wherein said substrate is a conductive substrate, said light-emitting laminating structure has a light-exiting surface opposite to said substrate.

16. The light-emitting device according to claim 1, wherein said an ohmic contact layer is GaAs.

17. A light-emitting device, comprising:
    a light-emitting laminating structure which includes
    an aluminum-free layer,
    a transition layer disposed on said aluminum-free layer,
    a current-spreading layer disposed on said transition layer opposite to said aluminum-free layer,
    a first type semiconductor layer disposed on said current-spreading layer opposite to said transition layer,
    an active layer disposed on said first type semiconductor layer opposite to said current-spreading layer, and
    a second type semiconductor layer disposed on said active layer opposite to said first type semiconductor layer,
    wherein
    said current-spreading layer has aluminum, and, in said current-spreading layer, a relative content of said aluminum with respect to a composition of said current-spreading layer is fixed, and
    said transition layer has aluminum, and, in said transition layer, a relative content of said aluminum with respect to a composition of said transition layer is less than said relative content of said aluminum in said current-spreading layer.

18. A method for producing a light-emitting device, comprising:
    forming an ohmic contact layer;
    forming a transition layer on the ohmic contact layer;
    forming a current-spreading layer on the transition layer opposite to the ohmic contact layer;
    forming a first type semiconductor layer on the current-spreading later opposite to the transition layer;
    forming an active layer on the first type semiconductor layer opposite to the current-spreading layer; and forming a second type semiconductor layer on the active layer opposite to the first type semiconductor layer, wherein the current-spreading layer has aluminum, and, in said current-spreading layer, a relative content of the aluminum with respect to a composition of the current-spreading layer is fixed, and the transition layer has aluminum, and, in said transition layer, a relative content of the aluminum with respect to a composition of the transition layer is less than the relative content of the aluminum in the current-spreading layer.

19. The method according to claim 18, further comprising:

forming an electrode on the ohmic contact layer such that a part of the ohmic contact layer is exposed from the electrode, the current-spreading layer having a first portion that is corresponding in position to the electrode, and a second portion that is outside of the electrode;

removing the part of the ohmic contact layer exposed from the electrode and the transition layer underlying the exposed part of the ohmic contact layer to expose the second portion of the current-spreading layer; and patterning the second portion of the current-spreading layer to form a patterned second portion which functions as a light-exiting surface.

20. The method according to claim 19, wherein the patterned second portion has a thickness that is less than a thickness of the first portion, the thickness of the second portion of the current-spreading layer ranging from 2 μm to 4 μm.

* * * * *